(12) United States Patent
Turner et al.

(10) Patent No.: US 9,467,111 B2
(45) Date of Patent: Oct. 11, 2016

(54) OPERATOR ADJUSTABLE FULL-BANDWIDTH AUDIO SPECTRAL SHIFTING CONTROL WITH A SIMPLE LISTENER INTERFACE

(75) Inventors: Andrew Dow Turner, Los Angeles, CA (US); Tomlinson Holman, Yucca Valley, CA (US)

(73) Assignee: Audyssey Laboratories, Los Angeles, CA (US)

( * ) Notice: Subject to any disclaimer, the term of this patent is extended or adjusted under 35 U.S.C. 154(b) by 573 days.

(21) Appl. No.: 13/538,942

(22) Filed: Jun. 29, 2012

(65) Prior Publication Data

US 2014/0003627 A1  Jan. 2, 2014

(51) Int. Cl.
*H03G 5/00* (2006.01)
*H03G 5/02* (2006.01)
*H03G 5/16* (2006.01)

(52) U.S. Cl.
CPC ............. *H03G 5/025* (2013.01); *H03G 5/165* (2013.01)

(58) Field of Classification Search
CPC .......... H03G 5/00; H03G 5/005; H03G 5/02; H03G 5/025; H03G 5/16; H03G 5/165
USPC .............. 381/98, 101–103, 99; 700/94
See application file for complete search history.

(56) References Cited

U.S. PATENT DOCUMENTS

| | | | |
|---|---|---|---|
| 6,661,900 B1* | 12/2003 | Allred et al. | 381/103 |
| 2003/0165245 A1* | 9/2003 | Lau | 381/98 |
| 2009/0316930 A1* | 12/2009 | Horbach et al. | 381/99 |
| 2010/0266143 A1* | 10/2010 | Oliver | 381/103 |
| 2011/0038490 A1* | 2/2011 | Yang et al. | 381/103 |
| 2011/0096933 A1* | 4/2011 | Eastty | 381/56 |
| 2011/0150241 A1* | 6/2011 | Christoph et al. | 381/103 |
| 2012/0063614 A1* | 3/2012 | Crockett et al. | 381/98 |
| 2013/0027995 A1* | 1/2013 | Harnefors et al. | 363/40 |
| 2013/0163784 A1* | 6/2013 | Tracey et al. | 381/103 |

OTHER PUBLICATIONS

"The z-Q6 Six-Channel Mastering Equalizer", 2000, Z-Systems Audio Engineering, p. 1-10.*

* cited by examiner

*Primary Examiner* — Xu Mei
*Assistant Examiner* — Con P Tran
(74) *Attorney, Agent, or Firm* — Kenneth L. Green; Averill & Green

(57) ABSTRACT

A spectral response shifting method allows a listener to shift a system response to match their preferences. The method includes a lookup table of coefficients for a number of Infinite Impulse Response (IIR) filter or Finite Impulse Response (FIR) filter which are selected by the listener to shift the response either toward bass or towards treble. In one embodiment, $5^{th}$ order IIR biquads filters are used at ½ dB increments from −6 dB to +6 dB. For example, when a listener selects the "more treble by 1 dB" setting, a set of coefficients is loaded providing −1 dB in bass cut at the lowest frequency of the audible spectrum (20 Hz) and +1 dB of treble boost at the highest frequency of the audible spectrum (20 kHz). The frequency response at all other points is defined by interpolating between the highest frequency (20 kHz) and the lowest frequency (20 Hz).

16 Claims, 4 Drawing Sheets

OPERATOR ADJUSTABLE FULL-BANDWIDTH AUDIO SPECTRAL SHIFTING CONTROL WITH A SIMPLE LISTENER INTERFACE

BACKGROUND OF THE INVENTION

The present invention relates to spectral shaping and in particular to simple method for shifting the spectral response towards bass or treble while avoiding a need to re-tune a system having multiple adjustments.

Typical tone controls adjust the bass, treble, and midrange individually, without allowing shifting the entire spectrum towards bass or treble. Often, individual listeners have different preferences which may be addressed by a simple shift in the frequency response towards the bass or treble based on the listener's preference or based on the program material/recording style. Unfortunately, known tone controls in sound systems (for example, professional, "prosumer", and consumer) do not provide an overall spectral shift towards bass or treble, and obtaining this simple shift in tonal response, when applied to an already calibrated sound system and environment (for example, one which has had a custom equalization applied to it), requires multiple adjustments of independent bass and treble controls.

BRIEF SUMMARY OF THE INVENTION

The present invention addresses the above and other needs by providing a method for spectral response shifting which allows a listener to shift a system response to match their preferences. The method includes a lookup table of coefficients for a number of Infinite Impulse Response (IIR) filters or Finite Impulse Response (FIR) filters which are selected by adjusting a listener control across various levels of treble boost and bass cut or treble cut and bass boost. In one embodiment, $5^{th}$ order IIR biquads are used at ½ dB increments from −6 dB to +6 dB. For example, when the listener selects the "more treble by 1 dB" setting, a set of coefficients is loaded providing −1 dB in bass cut at the lowest frequency of the audible spectrum (20 Hz) and +1 dB of treble boost at the highest frequency of the audible spectrum (20 kHz). The frequency response at all other points is defined by interpolating a straight line (on a logarithmic frequency versus decibel level plot) between the highest frequency (20 kHz) and the lowest frequency (20 Hz). No independent adjustment of just the bass or just the treble is required. The method may be applied to room equalization, headphone equalization, automotive equalization, loudspeaker systems, micro speaker systems, sound recording systems, and to any audio signal.

In accordance with one aspect of the invention, there is provided a spectral shifting control which shifts the entire sound spectrum simultaneously with a single listener adjustment allowing for a more direct and efficient method for reaching a listener's preferences.

In accordance with another aspect of the invention, there is provided an algorithm or software run by a Digital Signal Processor (DSP) or a computer, or implemented in an analog circuit using, for example, selectable resistor networks, allowing a listener to shift an existing spectral response to match their personal preferences. In one embodiment, a set of custom made, fixed and selectable (using a table) equalization coefficients are used in "biquad" type filter topologies. Such coefficients may be released to the listeners via embedded software/firmware code.

In accordance with yet another aspect of the invention, there is provided a quick and simple control to shift the overall spectral response of a sound reproduction system. The spectral shift control does not require a trained operator; has almost no learning curve (simply adjusting a single knob shows the listener how the invention works); is flexible across various program material, maintains the baseline system tuning by not adding any additional, unnecessary peaks and dips to the sound system response; does not require heavy DSP processing capability; and can be implemented in various ways (simple IIR filter or FIR filter are both equally capable).

In accordance with yet another aspect of the invention, there is provided a method for the shifting a room equalization towards bass or towards treble. The method includes steps of deriving a baseline room equalization filter, deriving a family of filters which increase bass and decrease treble, or decrease bass and increase treble from the baseline, representing the family of filters using a lookup table of filter coefficients, storing the lookup table of filter coefficients in a selectable table, selecting one set of coefficients of the family of filter coefficients to suit a listener, apply the set of listener selected filter coefficients to the room equalization to obtain a spectral shifted room equalization, and apply the shifted room equalization to an audio signal(s).

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

Figure 1:
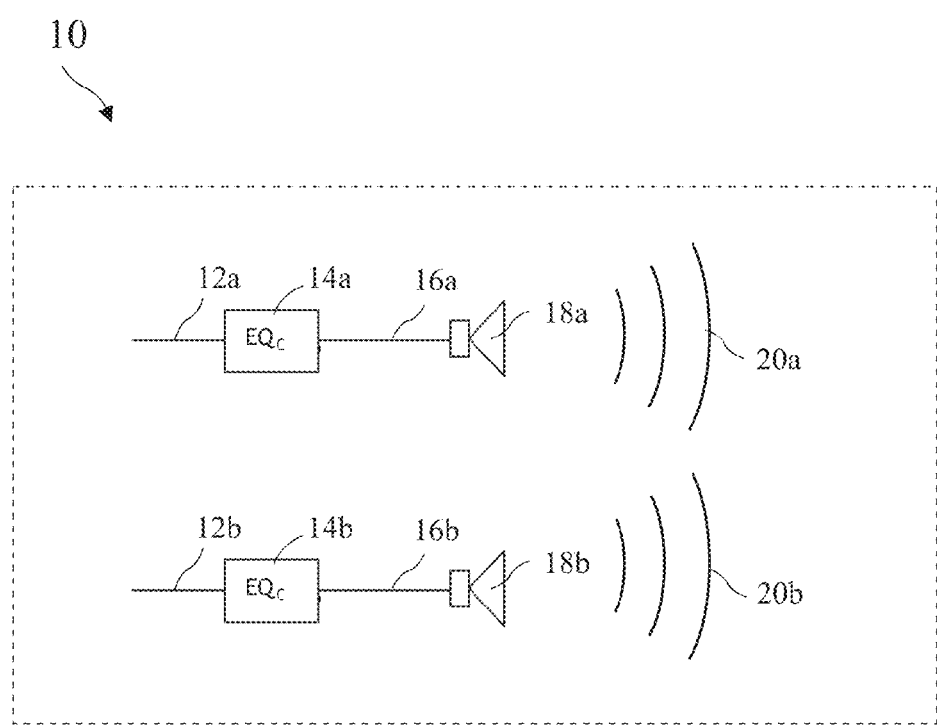
FIG. 1 depicts an audio system with equalization filters according to the present invention.

An example system level description of a prior art two-channel audio system 10, with equalization filters 14a and 14b in each channel for correcting loudspeaker-room acoustics, is shown in FIG. 1. The system 10 receives two channels 12a and 12b processed in parallel. The equalization filters 14a and 14b process the channels 12a and 12b to provide equalized signals 16a and 16b provided to speakers 18a and 18b. The equalization filters 14a and 14b are designed to process the channels 12a and 12b to overcome poor sound environments to provide accurate sound reproduction signals 20*a* and 20*b*. However, different listeners have different subjective preferences with respect to bass and treble content of the sound reproduction signals 20*a* and 20*b*.

Figure 2:
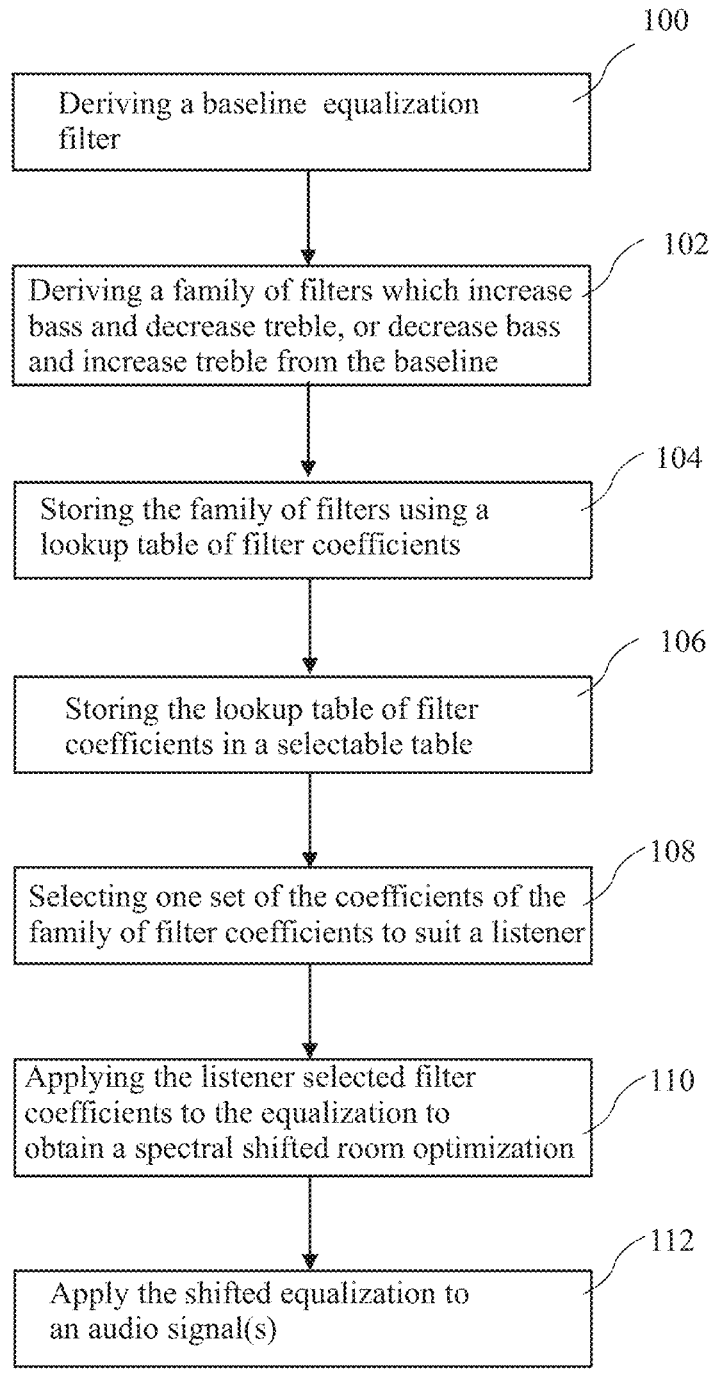
FIG. 2 is a method according to the present invention.

FIG. 2 is a method for the shifting room towards bass or towards treble. The method includes steps of deriving a baseline equalization filter at step 100; deriving a family of filters which increase bass and decrease treble, or decrease bass and increase treble from the baseline at step 102; representing the family of filters using a lookup table of filter coefficients at step 104; storing the lookup table of filter coefficients in a selectable table at step 106; selecting one of the family of filter coefficients to suit a listener at step 108; apply the listener selected filter coefficients to the equalization to obtain a shifted equalization at step 110; and apply the shifted equalization to an audio signal(s) at step 112.

Figure 3:
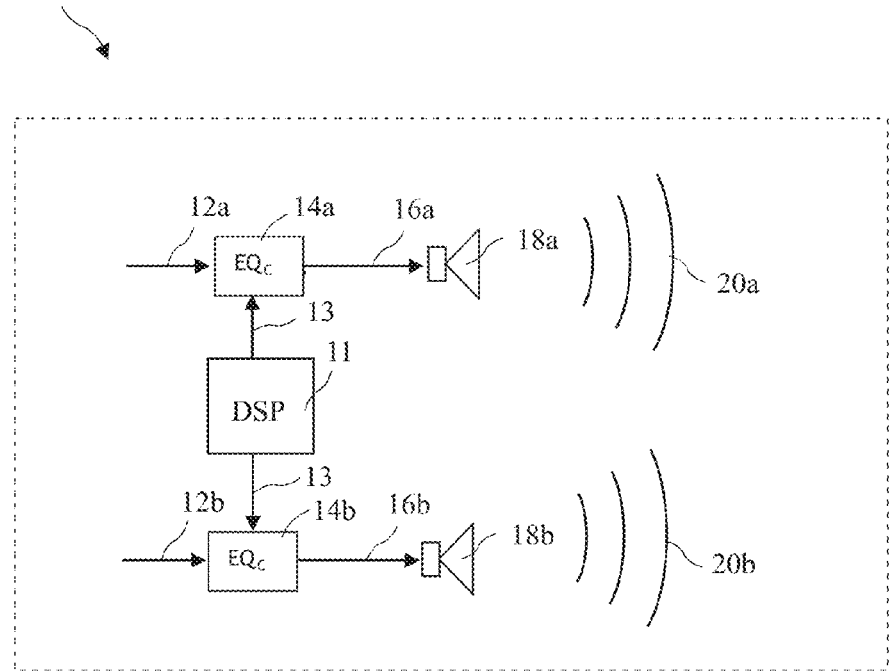
FIG. 3 shows an audio system including a Digital Signal Processor (DSP) storing equalization filter sets according to the present invention.

An audio system including a Digital Signal Processor (DSP) 11 storing equalization filter sets is shown in FIG. 3. DSP 11 of the audio system 10*a* may retrieve the selected lookup table coefficients from memory, in response to a listener selection (e.g., a listener actuated rotary encoder or graphical user interface, such as an iPhone or Android mobile application).

Figure 4:
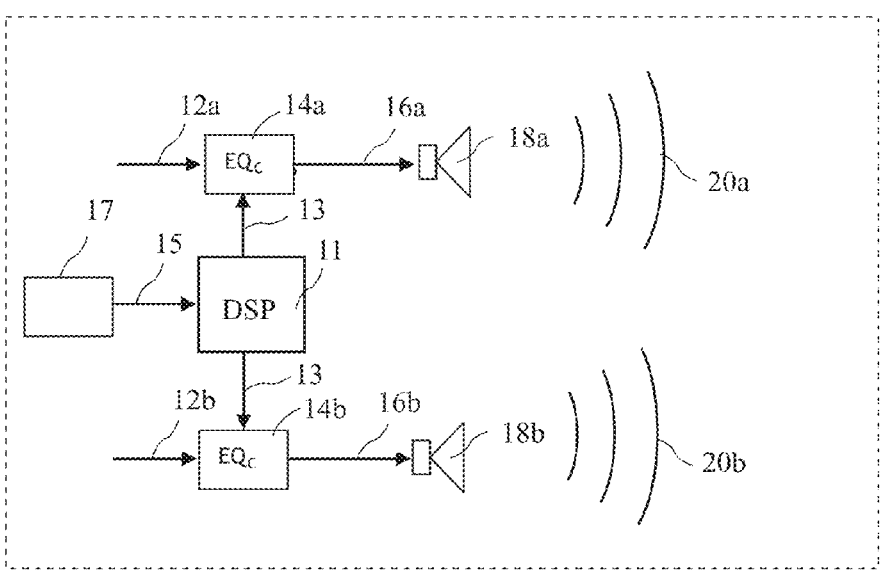
FIG. 4 shows an audio system including the DSP receiving remotely stored equalization filter sets according to the present invention.

An audio system 10*b* having the DSP 11 receiving remotely stored equalization filter sets is shown in FIG. 4. Depending on the audio system 10*b* implementation, an application may send the listener selected lookup table coefficients to the DSP 11 using remotely stored lookup table coefficients (for example, the lookup table coefficients may be stored on an iPhone or other remote device 17 rather than on the DSP 11, with the application sending the appropriate coefficient set whenever an update to the listener setting is required). The lookup table coefficients may be provided to the DSP 11 over a connection 15 which may be a wired connection or wireless connection.

In a lookup table coefficient design process, a script/algorithm may be used to set low and high endpoints in Hz, an inflection point in Hz (where the frequency response of the transfer function crosses 0 dB), a number of steps, and a size of each step (in dB). The steps may be uniformly spaced (e.g., +1 dB, +2 dB, +3 dB, +4 dB, +5 dB, etc.) or non-uniformly spaced (e.g., +1 dB, +2 dB, +3 dB, +5 dB, +7 dB, etc.). Filters are output as Finite Impulse Response (FIR) or Infinite Impulse Response (IIR) coefficients for each individual setting (filling the lookup table). Hand fitting to a target using biquads may be performed as well. The methods of FIG. 2 may be applied to room equalization, headphone equalization, loud speaker equalization, automotive equalization, micro speaker equalization, to signal paths in recording systems, and to any audio signal.

The equalization filtering is a linear process. As a result, the lookup table coefficients may be applied to modify the baseline equalization filter coefficients wherein the spectral shift filter coefficients are convolved with baseline equalization coefficients offline to obtain a spectral shifted equalization filter (each time the settings are updated). Alternatively, the lookup table coefficients may be applied as a separate spectral shift filter operating sequentially with the baseline equalization filtering wherein the baseline equalization may be convolved with the input in real time and the resultant signal sequentially (serially) convolved with the selected spectral shift filter in real time (or in the opposite order). For memory optimization purposes, it may be preferred to separately convolve the signal(s) with the selected spectral shift filter so that the audio system 10*a* or 10*b* is not required to store the entire equalization filter across all levels of the spectral shift adjustments.

Figure 5:
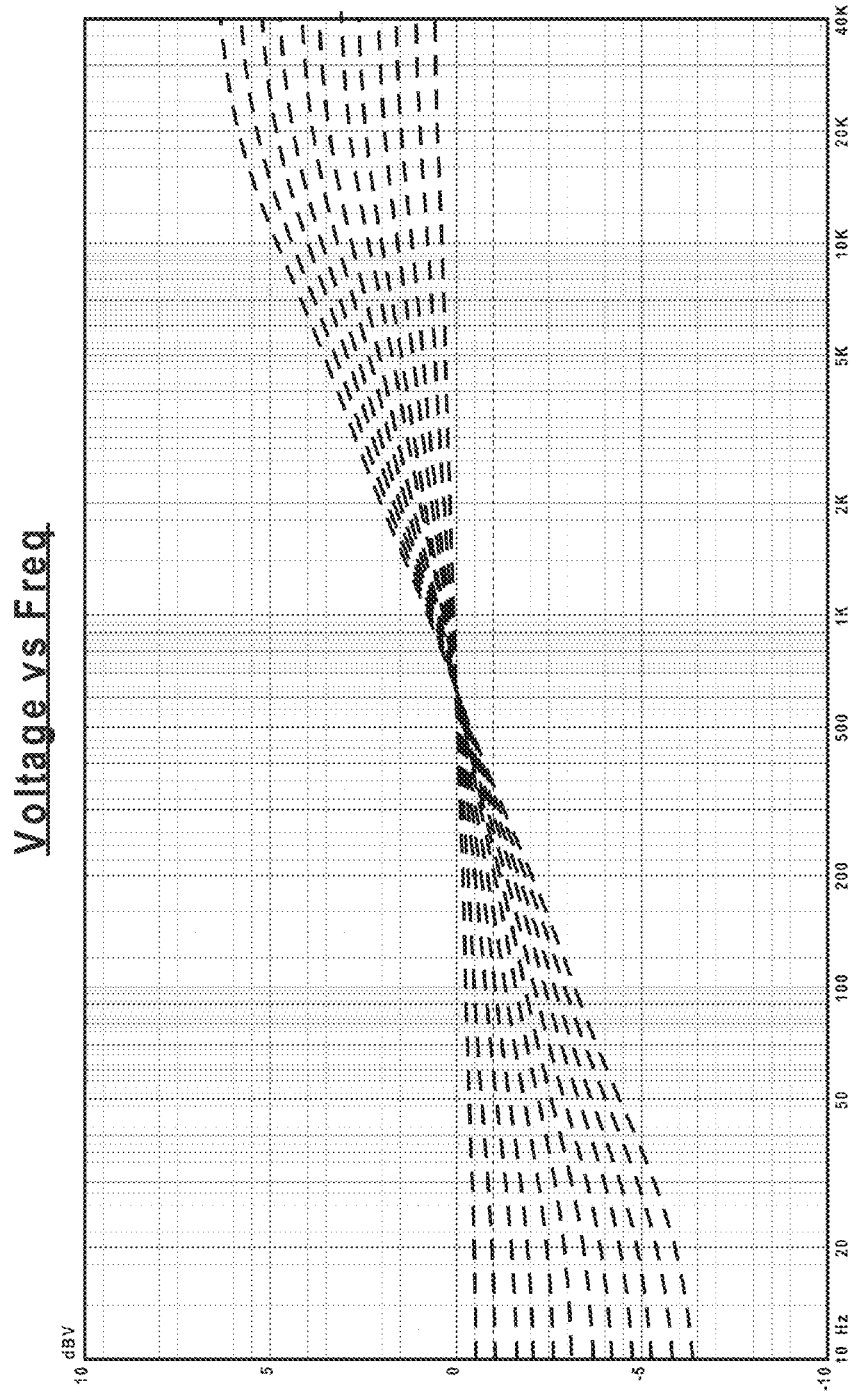
FIG. 5 is an example of filters shifting the spectrum towards treble.

An example of filters shifting the spectrum towards treble is shown in FIG. 5. The inflection point around 640 Hz was selected based on extensive listener usability testing and trials. The inflection point is important to allow easy and quick adjustment and results which correlate with what a (not necessarily trained or expert) listener expects from the "more bass" or "more treble" descriptions. However, there are reasons for shifting the 640 Hz inflection point for system specific purposes. In low and/or high frequency constrained systems which cannot reproduce the full audible spectrum in any significant way, the inflection point may need to be shifted up or down in frequency from 640 Hz. For example, an inexpensive television speaker will have severely limited low frequency output capability, and the inflection point would likely be shifted up in frequency from 640 Hz by some amount. While FIG. 5 shows the 640 Hz inflection point, a spectral shifting system or method according to the present invention having an inflection point above or below 640 Hz is intended to come within the scope of the present invention.

While the invention herein disclosed has been described by means of specific embodiments and applications thereof, numerous modifications and variations could be made thereto by those skilled in the art without departing from the scope of the invention set forth in the claims.

We claim:

1. A method for equalizing an audio signal comprising receiving the audio signal, filtering the audio signal by a baseline equalization filter, providing the equalized audio signal to a transducer, and transmitting sound waves, an improvement comprising:
   an improved method for shifting a frequency spectrum of the audio signal towards bass or treble, the improved method comprising:
      deriving a family of full bandwidth fixed spectral shifting filter coefficients independently of the audio signal, each member of the family of full bandwidth fixed spectral shifting filter coefficients providing one of:
         increase bass and decrease treble from a baseline to varying degrees, or
         decrease bass and increase treble from the baseline to varying degrees;
      storing the family of full bandwidth fixed spectral shifting filter coefficients in a lookup table;
      selecting one of the members of the family of full bandwidth fixed spectral shifting filter coefficients to suit a listener;
      combining the listener selected spectral shifting filter coefficients and the baseline equalization filter to obtain a spectral shifted equalization;
      apply the spectral shifted equalization to the audio signal; and
      providing the audio signal to the transducer to produce the sound waves for the listener,
   wherein:
      deriving a family of fixed spectral shifting filter coefficients includes selecting inputs to an algorithm including:
         low and high endpoints in Hz;
         an inflection point in Hz;
         a number of steps; and
         a size of each step in dB;
      the spectral shifting filter coefficients are sets of Infinite Impulse Response (IIR) filter coefficients; and the sets of IIR filter coefficients are 5th order IIR biquads used at ½ dB increments from −6 dB to +6 dB.

2. The method of claim 1, further including retrieving the selected spectral shifting filter coefficients from a Digital Signal Processor (DSP) element of an audio system.

3. The method of claim 1, further including retrieving the selected spectral shifting filter coefficients from a remotely stored lookup table and storing the selected filter coefficients in a Digital Signal Processor (DSP) element of an audio system.

4. The method of claim 1, wherein the inflection point is approximately 640 Hz.

5. The method of claim 1, wherein the steps are uniformly spaced in dB.

6. The method of claim 1, wherein the number of steps is 24.

7. The method of claim 1, wherein the spectral shifting filter coefficients are sets of Finite Impulse Response (FIR) filter coefficients.

8. The method of claim 1, wherein deriving a family of fixed spectral shifting filter coefficients includes selecting inputs to an algorithm including:
a low endpoint in Hz;
a high endpoint in Hz;
an inflection point;
a spectral shift range; and
a step size in dB.

9. The method of claim 8, wherein selecting a spectral shift range comprises selecting a range between approximately −6 db and approximately +6 dB.

10. The method of claim 1, further including a lookup table coefficient design process including hand fitting to a target equalization using biquads.

11. The method of claim 1, wherein applying the listener selected spectral shifting filter coefficients to the baseline equalization filter to obtain a spectral shifted equalization comprises applying the selected spectral shifting filter coefficients to modify the baseline equalization filter.

12. The method of claim 11, wherein applying the selected spectral shifting filter coefficients to modify the baseline equalization filter comprises convolving the selected spectral shifting filter coefficients with the baseline equalization filter offline to obtain a spectral shifted equalization filter.

13. The method of claim 1, wherein applying the listener selected spectral shifting filter coefficients to the baseline equalization filter to obtain a spectral shifted equalization comprises applying the selected spectral shifting filter sequentially with the baseline equalization filter.

14. The method of claim 1, wherein the equalization is room equalization.

15. A method for shifting a frequency spectrum of an audio signal towards bass or treble, the method comprising:
deriving a baseline room equalization filter;
deriving a fixed family of full bandwidth spectral shift filters in a digital signal processor independently of the audio signal, each spectral shift filter selectable to both increase bass and decrease treble, or to decrease bass and increase treble from the baseline, each member of the fixed family of full bandwidth spectral shift filters specified by:
a low endpoint in Hz;
a high endpoint in Hz;
an inflection point in Hz;
a number of uniformly spaced steps; and
a step size in dB;
storing the fixed family of full bandwidth spectral shift filters in a lookup table;
selecting one set of the full bandwidth spectral shift filters from the lookup table to suit a listener;
convolving the selected full bandwidth spectral shift filter with the baseline room equalization filter offline to obtain a spectral shifted equalization filter;
applying the spectral shifted equalization filter to an audio signal; and
providing the audio signal to a transducer to produce sound waves for the listener,
wherein the spectral shifting filter coefficients are sets of Infinite Impulse Response (IIR) filter coefficients comprising 5th order IIR biquads used at ½ dB increments from −6 dB to +6 dB.

16. A method for shifting a frequency spectrum of a full bandwidth audio signal towards bass or treble, the method comprising:
deriving a baseline room equalization filter;
deriving a fixed family of full bandwidth filters in a digital signal processor independently of the audio signal, each full bandwidth filter of the fixed family of full bandwidth filters is derived to both increase bass and decrease treble, or to decrease bass and increase treble from the baseline room equalization filter, each of the full bandwidth filters specified by:
a low endpoint in Hz;
a high endpoint in Hz;
an inflection point in Hz; and
a set of non-uniformly spaced steps in dB;
storing the fixed family of full bandwidth filters in a lookup table of filter coefficients;
selecting one of the full bandwidth filters from the family of full bandwidth filters to suit a listener;
applying the selected full bandwidth filter sequentially with the baseline equalization filtering;
applying the shifted room equalization to the audio signal; and
providing the audio signal to a transducer to produce sound waves for the listener,
wherein the spectral shifting filter coefficients are sets of Infinite Impulse Response (IIR) filter coefficients comprising 5th order IIR biquads used at ½ dB increments from −6 dB to +6 dB.

* * * * *